United States Patent
Yang et al.

(10) Patent No.: US 9,752,928 B2
(45) Date of Patent: Sep. 5, 2017

(54) IMPLEMENT MULTIPLE PIXEL OUTPUT FOR PHOTODIODE SIZE PIXELS

(71) Applicants: Guang Yang, Pasadena, CA (US); Loc Truong, Pasadena, CA (US)

(72) Inventors: Guang Yang, Pasadena, CA (US); Loc Truong, Pasadena, CA (US)

(73) Assignee: Forza Silicon Corporation, Pasadena, CA (US)

( * ) Notice: Subject to any disclaimer, the term of this patent is extended or adjusted under 35 U.S.C. 154(b) by 0 days.

(21) Appl. No.: 13/949,009

(22) Filed: Jul. 23, 2013

(65) Prior Publication Data

US 2014/0027609 A1    Jan. 30, 2014

Related U.S. Application Data

(60) Provisional application No. 61/675,207, filed on Jul. 24, 2012.

(51) Int. Cl.
*H01L 27/00* (2006.01)
*G01J 1/44* (2006.01)
*H01L 27/146* (2006.01)

(52) U.S. Cl.
CPC .......... *G01J 1/44* (2013.01); *H01L 27/1461* (2013.01); *H01L 27/14607* (2013.01); *H01L 27/14612* (2013.01)

(58) Field of Classification Search
CPC .......... H01L 27/1461; H01L 27/14607; H04N 5/37452
See application file for complete search history.

(56) References Cited

U.S. PATENT DOCUMENTS

| | | | |
|---|---|---|---|
| 6,724,426 B1* | 4/2004 | Berezin | H01L 27/14603 257/E27.131 |
| 8,319,166 B2* | 11/2012 | Kawahito | H01L 27/14609 250/208.1 |
| 2003/0042425 A1* | 3/2003 | Tashiro et al. | 250/370.11 |
| 2007/0051976 A1* | 3/2007 | Moody et al. | 257/186 |
| 2012/0002089 A1* | 1/2012 | Wang et al. | 348/297 |

* cited by examiner

*Primary Examiner* — Thanh Luu
(74) *Attorney, Agent, or Firm* — Law Office of Scott C Harris, Inc

(57) ABSTRACT

An image sensor pixel the conformist single pixel of a larger array. The image sensor pixel can be a large one, such as larger than 100 μm. The image sensor pixel has readout notes on multiple sides thereof, e.g. on to work for sides, that are symmetrically located on the pixel. The readout notes are simultaneously read out to read out a part of the image from the pixel.

13 Claims, 7 Drawing Sheets

Pixel design top view.

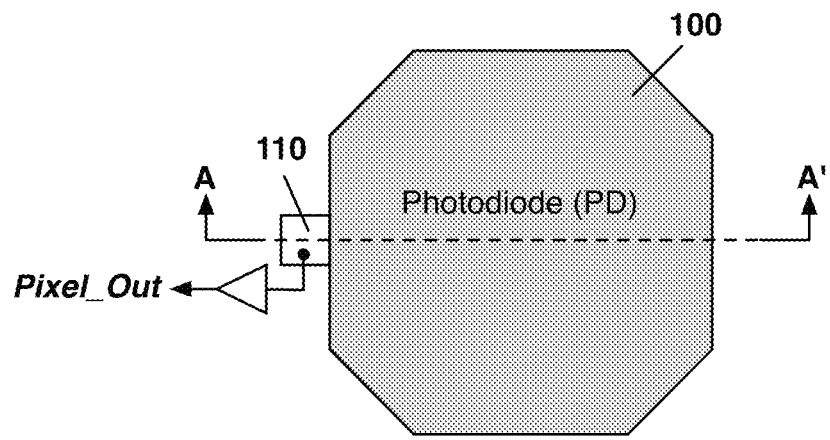
Figure 1A. Pixel design top view.
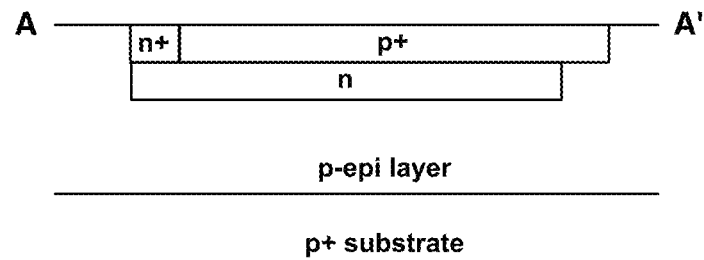
Figure 1B. Doping profile at cross-section AA'.
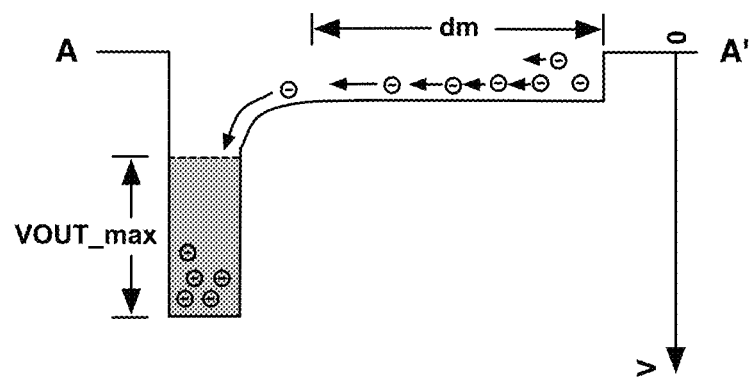
Figure 1C. Potential Diagram across AA'.

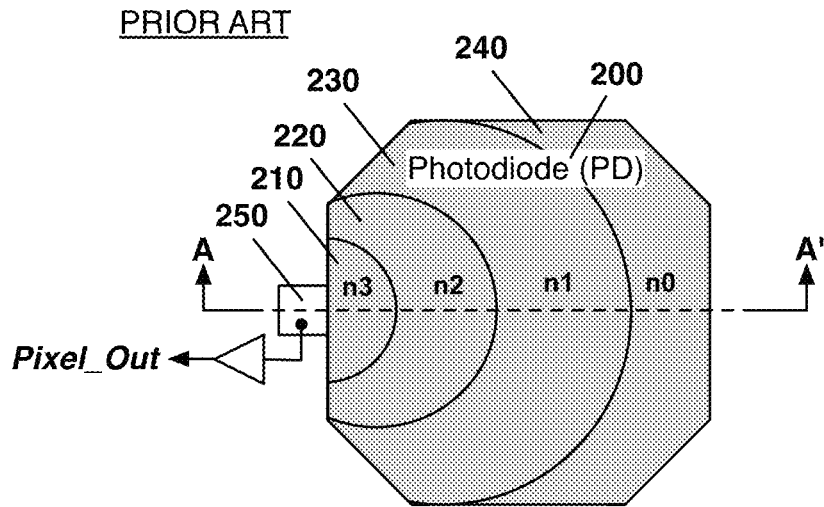
Figure 2A. Pixel design top view.
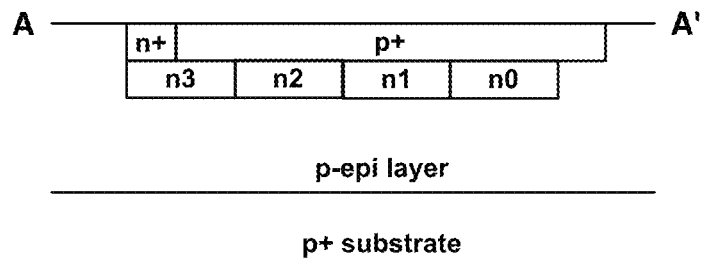
Figure 2B. Doping profile at cross-section AA'.
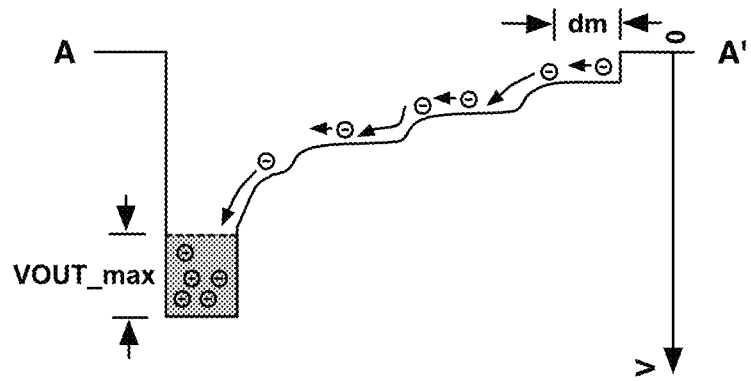
Figure 2C. Potential Diagram across AA'.

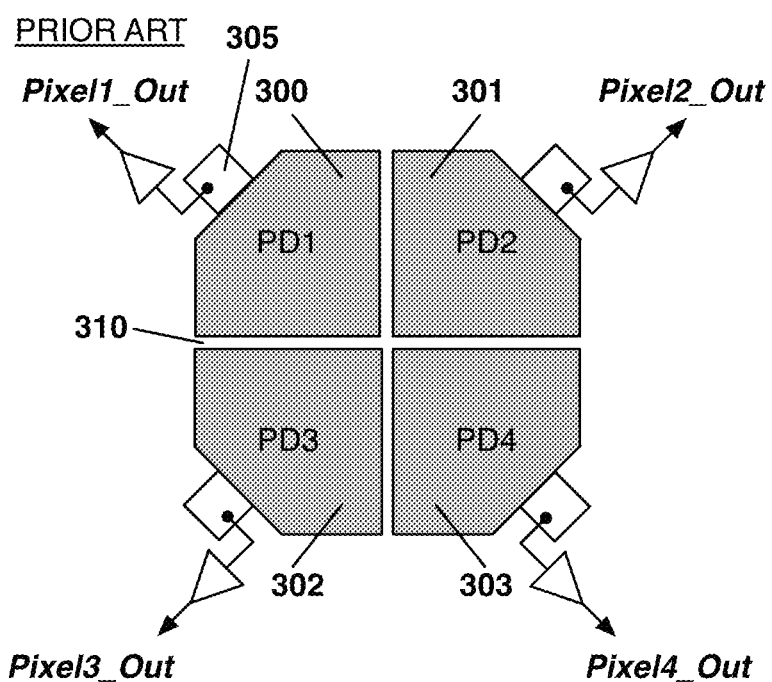
Figure 3. Uses multiple pixels to replace single photodiode.

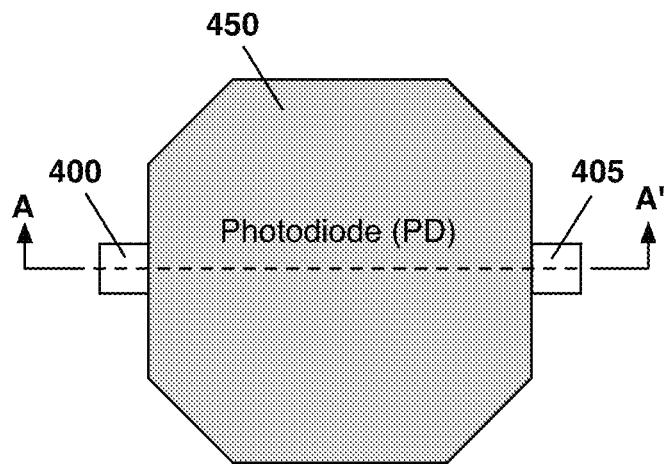
Figure 4A. Pixel design top view.
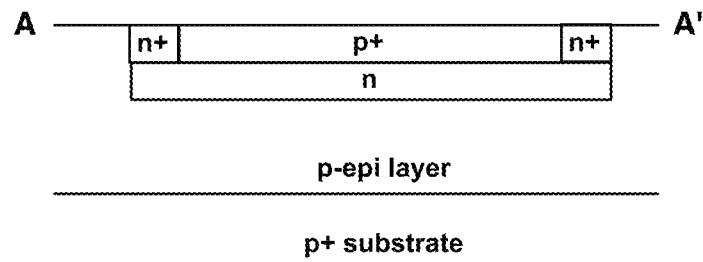
Figure 4B. Doping profile at cross-section AA.
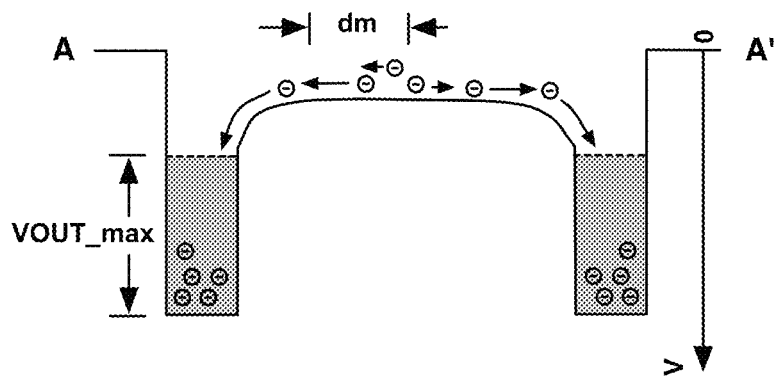
Figure 4C. Potential Diagram across AA'.

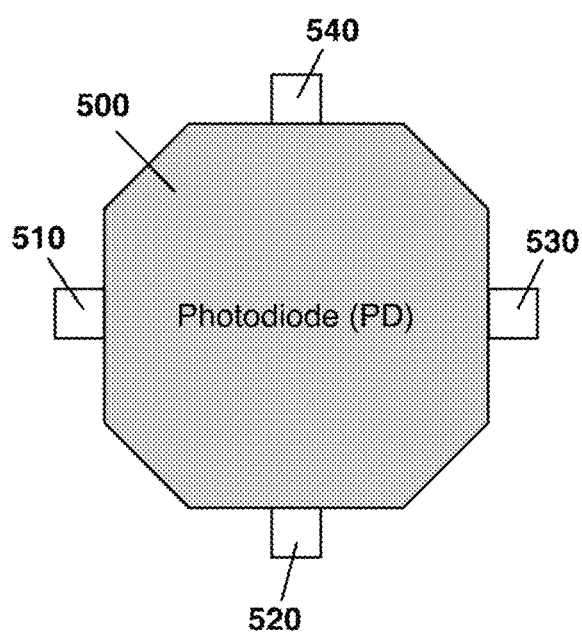
Figure 5. Another solution in which each pixel has 4 readout areas.

IMPLEMENT MULTIPLE PIXEL OUTPUT FOR PHOTODIODE SIZE PIXELS

This application claims priority from Provisional application No. 61/675,207, filed Jul. 24, 2012, the entire contents of which are herewith incorporated by reference.

BACKGROUND

Certain special applications, such as medical devices, machine control, and others, may require large size pixels (in the order of larger than 100 µm pitch) to catch the light beam(s). In additional, these require some kind of circuits in addition to a photon sensing device. These may use, for example, a 3T photodiode (PD), 3T partial pinned photodiode (PPPD), 4T pinned photodiode (PPD), and other structure to try and attain as close as possible to 100% fill factor to collect every photon from the light source.

FIGS. 1A, 1B and 1C show a typical pixel design with a photodiode. FIG. 1A shows the design where the Larger area 100 is the photodiode, and the photodiode 100 is connected to a sensing node 110. The sensing node 110 connected to the auxiliary circuit 111 that can include for example the reset gate, and an output buffer such as a source follower.

FIG. 1B shows an example of doping profile across the cross-section AA' in FIG. 1A. This doping profile assumes the photodiode structure is an n-type pinned photodiode. FIG. 1C shows the potential diagram at cross-section AA' of the doping profile in FIG. 1B. For an n-type pinned photodiode, the signal charge is photoelectrons generated by the light.

When using a large size photodiode, the charge transfer from photodiode to the output sensing node becomes a limit to the pixel performance. As shown in FIG. 1C, the potential under the most of the large photodiode region is flat, so there is no electrical field in this region. Photon generated charges (photo-electrons or photo-holes) in this zero electrical field region will diffuse to the sensing node 110, instead of being pushed by any electrical field. The charge diffusion causes random movements in all directions, and hence can be very slow. This charge diffusion time, Tdiff is inversely proportional to the square of the distance of flat potential region, dm. I.e., Tdiff $\propto 1/(dm)^2$.

When attempting to carry out any kind of fast readout, the slow movement of the photogenerated charges causes image lag. This image lag could be very high comparing to the signal level.

FIGS. 2A-2C show a prior art solution which uses multiple implants in a single photodiode. One of the common solutions (same as in early works on CCD) is to have multiple implant regions 210, 220, 230, 240 in the photodiode 200, as shown in FIG. 2A. The multiple implant doping profile is shown in FIG. 2B. The multiple implants in the photodiode create a stair type potential in the photodiode region, as shown in FIG. 2C. This stair potential generates an electrical field to push the photon-generated charge to the sensing node 250. The distance of flat potential region, dm, in this multiple implant structure becomes much shorter.

However, using multiple photodiode implants has disadvantages in CMOS sensor applications. Specifically, use of multiple photodiode implants brings complexities into the fabrication process and can thus increase the fabrication costs. And, such a process is not available in many of the image sensor fabrication foundries. In addition, these multiple implants can reduce the pixel output dynamic range. The power supply voltage range to the pixel is a limit to a dynamic range in a CMOS sensor. Each additional implant in the photodiode region causes a drop of the photodiode pinning voltage. Thus, the voltage swing of the sensing node drops significantly if the photodiode has multiple implants. I.e., compare to FIG. 1C, the pixel output swing, VOUT_max in FIG. 2C, becomes much lower. As the results, the pixel output swing as well as the dynamic region becomes very small for a pixel with multiple implants.

Another solution is to split the pixel into multiple pixels. FIG. 3 shows an example to split the photodiode to four (4) photodiodes 300, 301, 302, 303. Each photodiode has its own readout such as 305. However, the separation region 310 between the photodiodes, which is in the middle of the light spot, will possibly cause significant signal loss.

SUMMARY

Embodiments describe an approach to reduce the image lag at fast readout for large size CMOS sensor pixels. In large photodiode applications, the image lag limits the pixel performance. The invention is to reduce the image lag by using multiple outputs for the same pixel to reduce the image lag of the large pixel at fast pixel readout.

BRIEF DESCRIPTION OF THE DRAWINGS

In the Drawings:

FIG. 1A shows a conventional large pixel design top view;

FIG. 1B shows an example doping profile at cross-section AA' in FIG. 1A, assuming an n-type pinned photodiode;

FIG. 1C shows the potential diagram of cross-section AA' from the doping profile in FIG. 1B;

FIG. 2A shows the pixel design top view of a prior art solution which uses multiple implants in a single photodiode;

FIG. 2B shows an example doping profile at cross-section AA' in FIG. 2A, assuming an n-type pinned photodiode;

FIG. 2C shows the potential diagram of cross-section AA' from the doping profile in FIG. 2B;

FIG. 3 shows a prior art solution which uses multiple pixels to replace the single photodiode;

FIG. 4A shows the pixel design top view of a first embodiment in which each pixel has two readout areas;

FIG. 4B shows an example doping profile at cross-section AA' in FIG. 4A, assuming an n-type pinned photodiode;

FIG. 4C shows the potential diagram of cross-section AA' from doping profile in FIG. 4B;

FIG. 5 shows another solution in which each pixel has 4 readout areas;

Figure 6A:
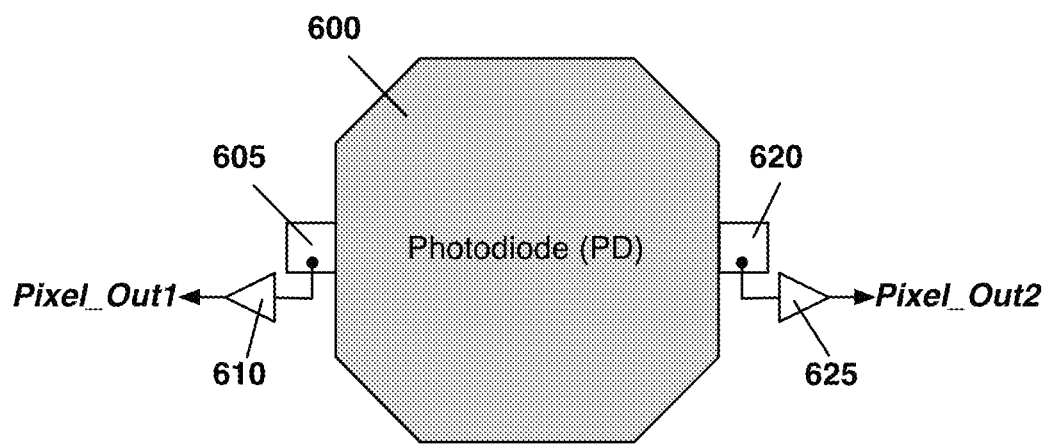
FIG. 6A shows a first embodiment of the pixel readout scheme in which each pixel readout area is read out separately for a two readout embodiment.

DETAILED DESCRIPTION this application describes implementing multiple sensing node areas within each photodiode pixel.

FIG. 4A shows the embodiment where multiple sensing nodes 400, 405 are connected to a single pixel 450. Each of the sensing nodes, 400, 405 are connected to an auxiliary circuit that can include for example a reset gate, and an output buffer such as a source follower. In the FIG. 4 embodiment, the large-size pixel 450 has its sensing node areas located at opposite ends of the pixel area. In this way, each of the multiple sensing nodes 400, 405 creates a charge readout path for the portion of the photogenerated charge in the photodiode region 450.

FIG. 4B shows the doping profile across the cross-section AA' in FIG. 4A, assuming that the photodiode is an n-type pinned photodiode. By doing this, and providing plural different readout areas, as shown in FIG. 4C, this reduces the maximum required traveling distance of the photogenerated charge, dm in FIG. 4C.

FIGS. 4A-4C shows the pixel with 2 outputs. If the photodiode has 2 outputs, the maximum photon-generated charge traveling distance is reduced by a factor of SQRT(2).

FIG. 5 shows an embodiment where the photodiode area 500 has 4 different sensing nodes 510, 520, 530, 540 at opposite edges of the area of the photodiode. This causes the maximum photon-generated charge traveling distance to be reduced by a factor of 2.

In the embodiments, the photon-generated charge in the photodiode can be collected by "any" sensing node during readout. Since the effective photon-generated charge traveling distance is reduced, image lag in fast readout can be suppressed.

Multiple output signals from the same pixel can be readout simultaneously. These output signals can be binned in either charge mode or voltage mode to reproduce the pixel output, which represents the total photon-generated charge in the entire photodiode.

Figure 6B:
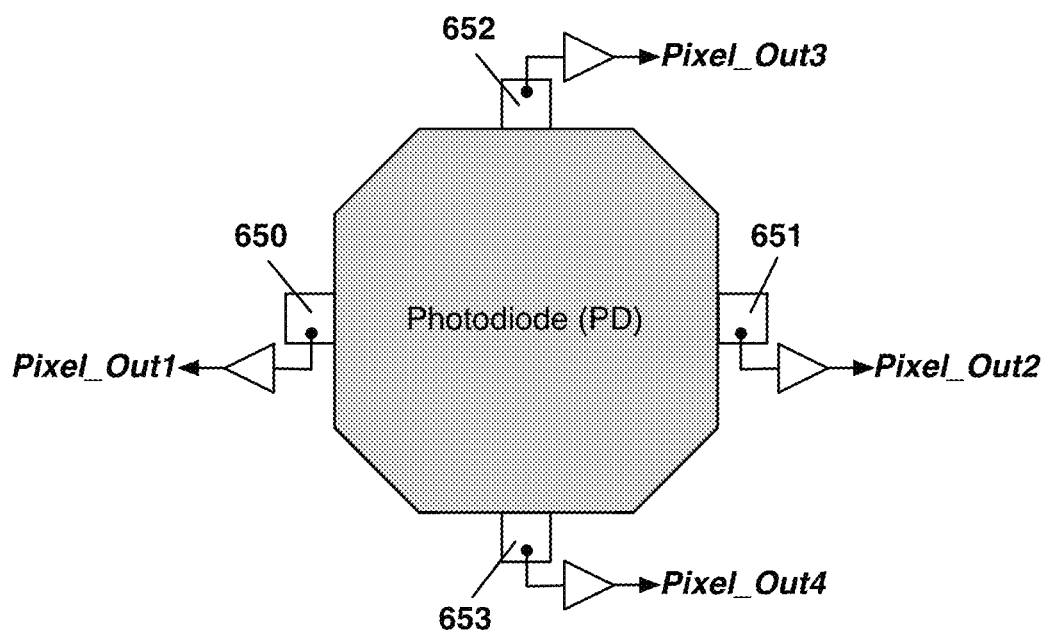
FIG. 6B shows the first embodiment of the pixel readout scheme in which each pixel readout area is read out separately for a four readout embodiment.

The multiple sensing nodes can have separate readout circuits, such that the single pixel is associated with multiple readout circuits. FIG. 6A shows a first embodiment of the pixel readout scheme in which each pixel readout area is read out separately. In FIG. 6A, the photodiode 600 has 2 outputs 605, 620. The output node 605 includes the readout circuits 610 and the output node 620 includes the readout circuits 625. In a similar way, the FIG. 6B embodiment, which is the 4 pixel readout part, has 4 separate readout nodes 650, 651, 652 and 653. In both these embodiments, after the pixel outputs from the sensing nodes, PIX_OUT1 to PIX_OUTn, are read, they are combined to produce a combined readout amount.

Figure 7A:
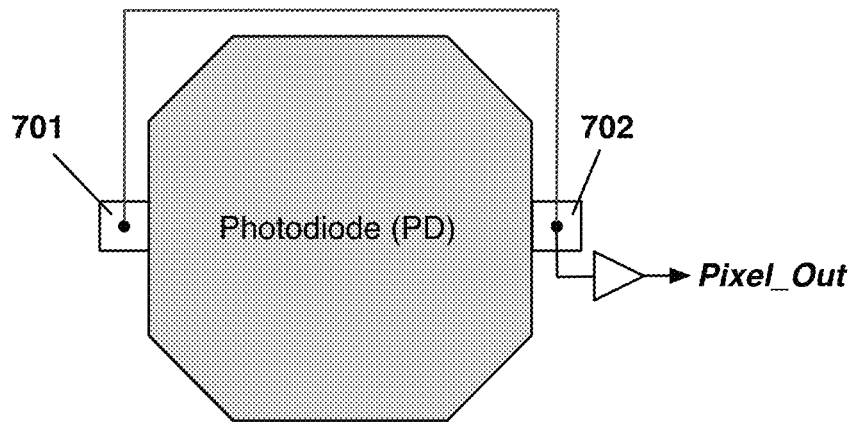
FIG. 7A shows another solution in which each pixel readout area are physically connected together (e.g., with metal wire) to use one pixel output for a two-readout embodiment.
Figure 7B:
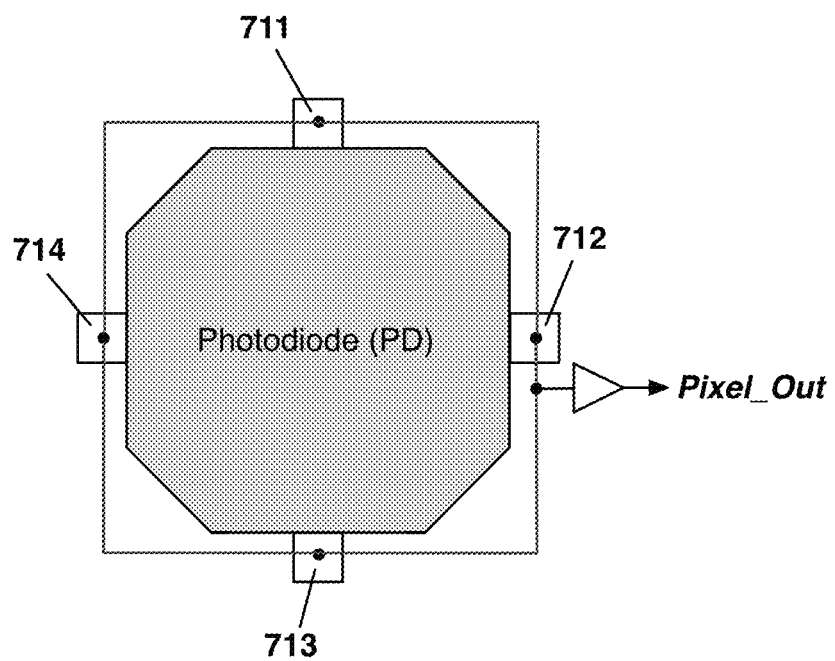
FIG. 7B shows the solution in which each pixel readout area are physically connected together (e.g., with metal wire) to use one pixel output for a four-readout embodiment.

An alternative embodiment is shown in FIGS. 7A and 7B. As shown in FIGS. 7A and 7B, the multiple sensing nodes (701, 702 in FIG. 7A; 711, 712, 713, 714 in FIG. 7B) can also be connected (e.g., using metal wire) to use one pixel readout circuit. This approach can simplify the readout circuit.

Thus, this invention can reduce the image lag, without changing the fabrication process and reduce the pixel output dynamic range.

Although only a few embodiments have been disclosed in detail above, other embodiments are possible and the inventors intend these to be encompassed within this specification. The specification describes specific examples to accomplish a more general goal that may be accomplished in another way. This disclosure is intended to be exemplary, and the claims are intended to cover any modification or alternative which might be predictable to a person having ordinary skill in the art. For example, other numbers of readout circuits could be used. Moreover, while the shows a symmetrical shape pixel, it should be understood that the pixel can be of other shapes which may facilitate use of the multiple different readout areas. Moreover, while the above describes 2 or 4 readout parts, it should be understood that there can be any number of readout parts, and that they can be located around the pixel at any location.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments.

The various illustrative logical blocks, modules, and circuits described in connection with the embodiments disclosed herein, may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. The processor can be part of a computer system that also has a user interface port that communicates with a user interface, and which receives commands entered by a user, has at least one memory (e.g., hard drive or other comparable storage, and random access memory) that stores electronic information including a program that operates under control of the processor and with communication via the user interface port, and a video output that produces its output via any kind of video output format, e.g., VGA, DVI, HDMI, displayport, or any other form. This may include laptop or desktop computers, and may also include portable computers, including cell phones, tablets such as the IPAD™, and all other kinds of computers and computing platforms.

A processor can be used to control the operation, or alternatively the operation can be controlled by a controller. The processor may be implemented as a combination of computing devices, e.g., a combination of a DSP and a microprocessor, a plurality of microprocessors, one or more microprocessors in conjunction with a DSP core, or any other such configuration. These devices may also be used to select values for devices as described herein.

The steps of a method or algorithm described in connection with the embodiments disclosed herein may be embodied directly in hardware, in a software module executed by a processor, using cloud computing, or in combinations. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of tangible storage medium that stores tangible, non transitory computer based instructions. An exemplary storage medium is coupled to the processor such that the processor can read information from, and write information to, the storage medium. In the alternative, the storage medium may be integral to the processor. The processor and the storage medium may reside in reconfigurable logic of any type.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer.

The memory storage can also be rotating magnetic hard disk drives, optical disk drives, or flash memory based storage drives or other such solid state, magnetic, or optical storage devices. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blue-ray disc where disks usually reproduce data magnetically, while discs reproduce data optically with lasers. Combinations of the above should also be included within the scope of computer-readable media. The computer readable media can be an article comprising a machine-readable non-transitory tangible medium embodying information indicative of instructions that when performed by one or more machines result in computer implemented operations comprising the actions described throughout this specification.

Also, the inventor(s) intend that only those claims which use the words "means for" are intended to be interpreted under 35 USC 112, sixth paragraph. Moreover, no limitations from the specification are intended to be read into any claims, unless those limitations are expressly included in the claims. The computers described herein may be any kind of computer, either general purpose, or some specific purpose computer such as a workstation. The programs may be written in C, or Java, Brew or any other programming language. The programs may be resident on a storage medium, e.g., magnetic or optical, e.g. the computer hard drive, a removable disk or media such as a memory stick or SD media, or other removable medium. The programs may also be run over a network, for example, with a server or other machine sending signals to the local machine, which allows the local machine to carry out the operations described herein.

Where a specific numerical value is mentioned herein, it should be considered that the value may be increased or decreased by 20%, while still staying within the teachings of the present application, unless some different range is specifically mentioned. Where a specified logical sense is used, the opposite logical sense is also intended to be encompassed.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An image sensor pixel, comprising:
a photosensor pixel part, having at least one extent which is 100 μm or larger;
said extent including a photocollection area, wherein the photocollection area comprises an n doped layer, buried under a surface-facing p doped layer, where the n layer is wider than, and extends beyond edges of the p layer,
a first sensing node of an n+ type on a first side of said extent, located over and directly on top of a first portion of the n layer that extends beyond the p layer, and directly abutting the p+ type photocollection area, to receive charge from the photocollection area and provide the charge to a readout circuit; and
a second sensing node of n+ type on a second side of said extent opposite to the first side of the extent, located over and directly on top of a second portion of the n layer that extends beyond the p layer and directly abutting the p+ type photocollection area, said second sensing node also connected directly to the photocollection area to receive charge from the p+ type photocollection area,
and said first and second readout parts connected directly such that charge in the photocollection area always is simultaneously received by both the first readout part and the second readout part,
so that photogenerated charge generated within the photosensor pixel part is received simultaneously by both said first sensing node and said second sensing node, and where said photogenerated charge from the first sensing node and from the second sensing node is connected to a connection that connects to a location outside the pixel.

2. The pixel as in claim 1, further comprising a first readout circuit connected to the first sensing node, and a second readout circuit connected to the second sensing node.

3. The pixel as in claim 1, further comprising a third sensing node on a third side of said extent and a fourth sensing node on a fourth side of said extent.

4. The pixel as in claim 1, wherein said photosensor pixel part is a CMOS image sensor.

5. The pixel as in claim 1, further comprising a metal wire between said first sensing node and said second sensing node, and where a single readout circuit is connected to receive output from both said first sensing node and said second sensing node.

6. The pixel as in claim 1, wherein said readout parts are symmetrically spaced around edges of the photosensor pixel.

7. The pixel as in claim 1, further comprising a using a metal wire connected between said first sensing node and said second sensing node, to allow a single readout circuit to be connected to receive output from both said first sensing node and said second sensing node.

8. A method of reading pixels of an image sensor, comprising:

Operating a photosensor pixel by receiving information into a photocollection area that comprises an n doped layer, buried under a surface-facing p doped layer, where the n layer is wider than, and extends beyond edges of the p layer, Reading out information from multiple n+ type doped taps that directly abut against two opposite sides of the p layer, and are over the n layer at locations where the n layer extends beyond the edges of the p layer, Said multiple n+ type doped taps include at least a first sensing node and a second sensing node on opposite sides of an image sensor device, said device having at least one extent across said p doped layer which is 100 μm or larger, said arranging being in a way that the first and second sensing nodes are connected directly to the photocollection area of the image sensor device and said first and second readout parts connected directly such that charge in the photocollection area always is simultaneously received by both the first readout part and the second readout part;

using at least one readout circut for reading out charge from said first and second sensing nodes simultaneously to receive photogenerated charge from both said first and second sensing nodes representing the same part of an image simultaneously; and using a combination of said photogenerated charge from both said first and second readouts to represent said part of the image.

9. The method as in claim 8, wherein said part of said image is a single pixel of a multi-pixel image.

10. The method as in claim 8, wherein said first and second readout parts are symmetrically disposed on the pixel relative to one another.

11. The method as in claim 8, further comprising using third and fourth readout parts to obtain photogenerated charge at the same time as from said first and second readout parts.

12. The method as in claim 8, further comprising using a source follower in a sensing node at each of said readout parts.

13. The method as in claim 8, wherein the image sensor pixel has a photocollection area that comprises an n layer, buried under a surface-facing p layer, and multiple n-type doped taps that connect to the buried photocollection node, where said multiple n-type doped taps include the first readout part and the second readout part.

* * * * *